United States Patent [19]

Lewis

[11] Patent Number: 5,522,267
[45] Date of Patent: Jun. 4, 1996

[54] MODULAR DIAPHRAGM PRESSURE SENSOR WITH PERIPHERALLY MOUNTED ELECTRICAL TERMINALS

[75] Inventor: Brian D. Lewis, Los Gatos, Calif.

[73] Assignee: The Foxboro Company, Foxboro, Mass.

[21] Appl. No.: 471,338

[22] Filed: Jun. 6, 1995

Related U.S. Application Data

[63] Continuation of Ser. No. 102,554, Aug. 5, 1993, Pat. No. 5,438,876.

[51] Int. Cl.[6] .................................................. G01L 9/04
[52] U.S. Cl. ........................ 73/726; 73/727; 73/721; 73/706
[58] Field of Search ........................ 73/727, 726, 720, 73/721, 717, 723, 706; 338/4, 42; 29/621.1

[56] References Cited

U.S. PATENT DOCUMENTS

| | | | |
|---|---|---|---|
| 3,800,264 | 3/1974 | Kurtz et al. | 73/727 |
| 4,276,533 | 6/1981 | Tominaga et al. | 73/727 |
| 4,322,980 | 4/1982 | Suzuki et al. | 73/727 |
| 4,399,707 | 8/1983 | Wamstad et al. | 73/727 |
| 4,691,575 | 9/1987 | Sonderegger et al. | 73/727 |
| 4,763,098 | 8/1988 | Glenn et al. | 73/727 |

OTHER PUBLICATIONS

"Ceramic Packaging, Early Ceramic Packaging", Microelectronics Packaging Handbook, Van Nostrand Reinhold, New York, pp. 460–463 and cover pages.

*Primary Examiner*—Richard Chilcot
*Assistant Examiner*—Joseph L. Felber
*Attorney, Agent, or Firm*—Lahive & Cockfield

[57] ABSTRACT

A modular pressure sensor has a pressure-sensing element, electrical terminals, interconnections, and a support substrate. The pressure-sensing element produces an electrical signal indicative of pressure at local contacts and the interconnections apply the signal to the electrical terminals. The electrical terminals are secured to the substrate and extend along a peripheral surface of the substrate. The modular pressure sensor can mount, with different orientations, to a header to form a pressure transducer.

15 Claims, 5 Drawing Sheets

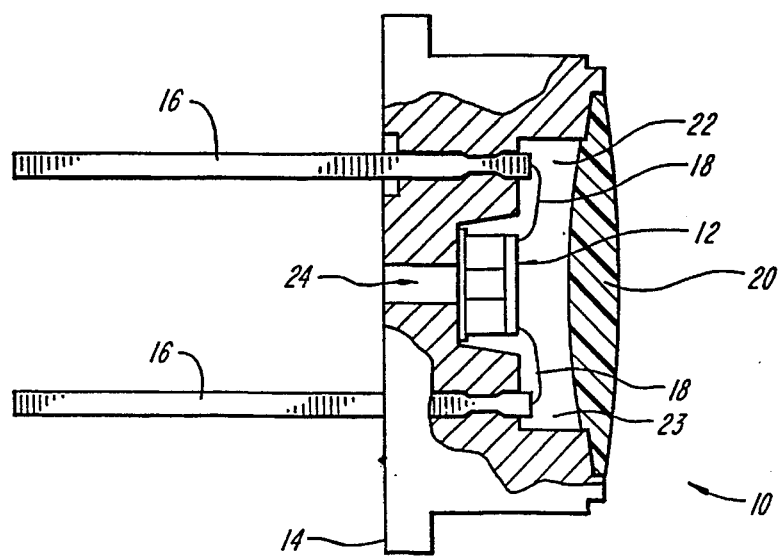
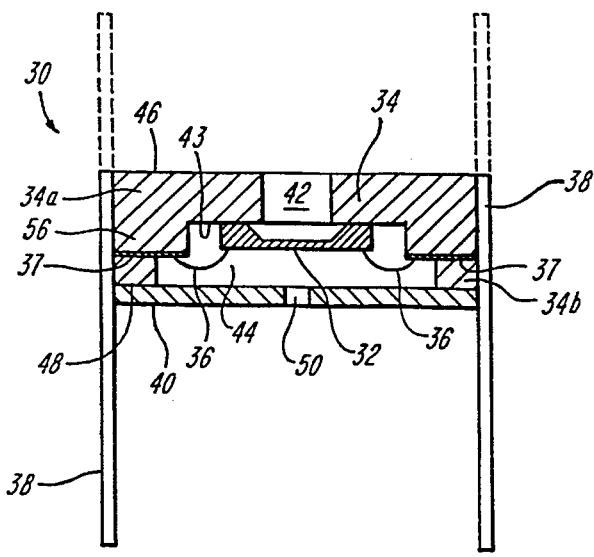
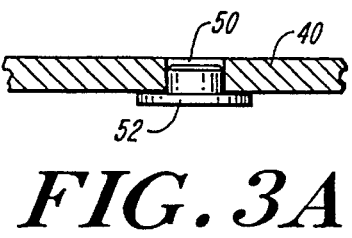
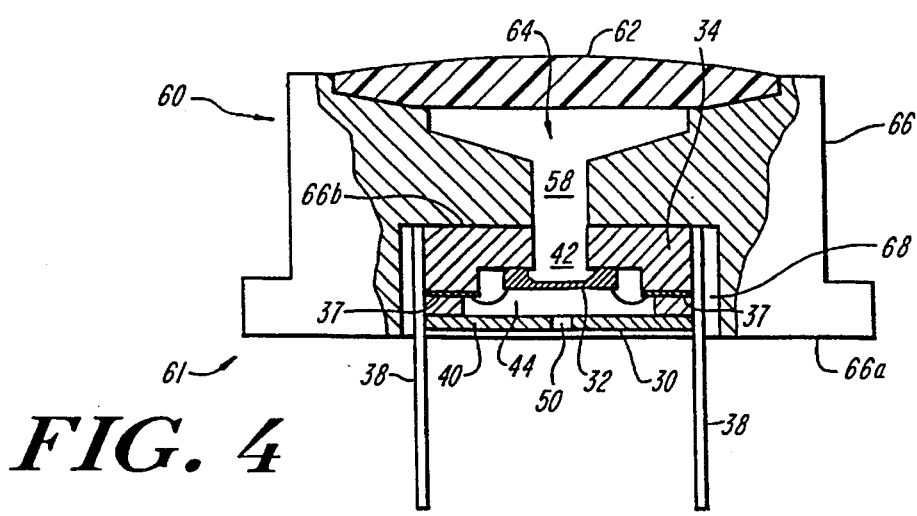

MODULAR DIAPHRAGM PRESSURE SENSOR WITH PERIPHERALLY MOUNTED ELECTRICAL TERMINALS

This application is a continuation application of Ser. No. 08/102,554 filed on Aug. 5, 1993, now U.S. Pat. No. 5,438,876.

BACKGROUND

This invention relates to apparatus and manufacturing methods for pressure sensors that employ pressure-sensitive diaphragms. It relates in particular to apparatus and assembly methods, including mechanical and electrical features, for a modular sensor sub-assembly having a pressure-sensing element mounted on a substrate, and having electrical interconnections between the sensing element and accessible terminals.

As used herein, a pressure-sensing element is a component of a pressure sensor and is structured as a solid-state pressure-sensing device that mounts a thin silicon diaphragm above an open chamber. Pressure variations cause the diaphragm to deflect into and out of the chamber. The deflections cause changes in an electrical parameter, typically capacitance or resistance, and in turn generate a signal indicative of pressure.

In one prior pressure-sensing element, the signal is transmitted to electrical terminals located proximal to the pressure-sensing element and extending through and away from the sensor substrate for connection to external electronics.

This configuration, however, is relatively difficult and costly to manufacture and is prone to performance degradation. For example, in one known prior practice, the electrical terminals are molded through the substrate and can trap air or leak air in a manner that detracts from the desired pressure-sensing performance. The sensor wire bands are also prone to damage from improper cleaning and other misuse.

Further, the use of a pressure-sensing element in hostile environments typically requires that the pressure sensor be coupled, by way of a pressure-responsive fluid, to an isolation (ISO) diaphragm mounted on a supportive housing or "header". This configuration forms an ISO sensor in which the pressure-sensing element is protected from contact with the hostile environment. One of the many applications of an ISO sensor is in an infusion pump, where the hostile environment includes cleaning solutions, blood, urine and other fluids.

A conventional ISO infusion pump sensor has a flexible slicone ISO diaphragm and a medical grade plastic header. The ISO diaphragm communicates the pressure forces in the blood substitute to the pressure-sensing element by a non-corrosive, inert fill fluid or pressure-responsive gel.

However, the pressure-sensing element in this prior ISO sensor is still subjected to relatively hostile forces that can act on the pressure-responsive gel between the element and the ISO diaphragm. One source of the relatively hostile forces that can act on the gel arises from improper handling or cleaning of the sensor. During these conditions, one portion on the isolation diaphragm can be pressed sufficiently so that other portions of the diaphragm bulge. This flexure of the diaphragm can cause movement of the gel around the wire bands sufficiently to fatigue or brush them. Extreme localized pressure on the isolation diaphragm can, in addition, damage the diaphragm of the sensing element.

It is accordingly an object of this invention to provide an improved pressure sensor and associated manufacture methodology that are free of the afore-mentioned difficulties.

It is another object of this invention to provide an improved apparatus and manufacturing method that attain a modular pressure sensor that is less difficult and costly to manufacture than comparable prior sensors formed with leads therethrough.

It is a further object of the invention to provide an improved ISO sensor for use in an infusion pump and like hostile environments.

More particular, an object of the invention is to provide a modular pressure sensor apparatus, and an associated manufacturing method, which are less prone to performance degradation inherent in like pressure sensors currently available.

Other objects of the invention will be apparent from the following description.

SUMMARY OF THE INVENTION

The invention attains these and other objects, according to one aspect, by providing a modular pressure sensor having a pressure-sensing element that has one or more electrical connections and one or more electrical terminals supported by a substrate. The substrate has a first surface bounded by an externally-accessible peripheral surface and has an opening on the first surface to a through passage which extends to the pressure-sensing element mounted with the substrate. The pressure-sensing element preferably has a pressure-responsive diaphragm with first and second opposed surfaces and has at least one electrical contact at which the element produces an electrical signal indicative of the deflection of the diaphragm. The diaphragm and the first surface of the substrate form, at least in part, a first chamber. At least one electrical terminal is mounted on the substrate and disposed external to the peripheral surface. The terminal extends along, or overlies, at least a portion of the peripheral surface. The terminal is arranged for removable and replaceable connection to an external electrical terminal. An electrical connection extends between the contact and the electrical terminal, to communicate electrical energy from the pressure-sensing element to the electrical terminal.

The substrate, which supports the pressure-sensing element, is typically electrically non-conductive. The pressure sensing element is usually adhesive bonded to the substrate. The substrate preferably is made from ceramic material, and can alternatively be a pyrex-based material. In an alternative embodiment, the pressure sensing element is bonded to a pyrex platform that is bonded to the substrate.

The electrical terminal of a pressure sensor according to the invention preferably extends transverse to and away from the first surface of the substrate to project from the substrate. It is preferably brazed to the peripheral surface.

The electrical connection of a pressure sensor according to the invention, and which extends between the contact and the terminal, is preferably formed by a metalization path within a laminated substrate. The connection can include one or more wire bonds connected between the contact and, for example, the metalization path. The electrical connection is formed, in another aspect, by an electrically conductive path external to the first surface of the substrate.

According to other aspects of a pressure sensor according to the invention, the pressure-sensing element seals a passageway which extends in the substrate between the first surface and a further surface of the substrate. The further surface can be a peripheral surface; or, alteratively, the further surface can be a mounting surface that is bounded, at least in part, by the peripheral surface, and that is substantially parallel to and spaced away from the first surface. The mounting surface is apertured by an opening to a through passage that extends to the pressure-sensing element mounted with the substrate. The mounting surface, together with the pressure-sensing element, bound, at least in part, a second chamber. The first and second chambers form, in effect, a passageway through the substrate between the first surface and the mounting surface and that is closed or sealed with regard to pressure by the pressure-sensing element.

According to other aspects of the invention, the electrical terminal can extend transverse to and away from the mounting surface to project from the substrate. It can further extend entirely between the mounting surface and the first surface, and, alternatively, extend beyond either or both the first surface and the mounting surface.

In yet another aspect of the invention, the pressure sensor includes a cover or lid and an aperture. In one such embodiment, the lid overlies the mounting surface to seal the second chamber with regard to pressure except for the aperture. The lid serves as a protective cover for the sensitive pressure-sensing element disposed with the substrate; it further allows the normal pressure-sensing operations to proceed unhampered.

In another aspect, the pressure sensor includes a header element having a housing and an isolation (ISO) diaphragm to form an ISO pressure transducer. The housing and the ISO diaphragm isolate the sensitive pressure-sensing element from harmful effects of the pressured gas or other fluid being measured. The housing mounts to the sensor substrate adjacent to the first surface and hermetically seals the first chamber between a first side of the ISO diaphragm and the first side of the pressure.-sensing element diaphragm. The pressure-sensing element detects pressure differences caused by the deflection of the ISO diaphragm, which responds to pressure differences between the first chamber and a second side of the ISO diaphragm.

The first chamber typically is filled with a pressure-responsive gel, oil or other incompressible fluid. The pressure-sensing element senses the pressure produced in the first chamber due to the deflection of the ISO diaphragm and coupled through the fill fluid.

A pressure sensor having one or more of the foregoing features according to the invention has several advantages. These include a simplified and less costly manufacture, because the electrical terminal does not extend through and within the substrate. Thus, practice of the invention avoids the tedious and difficult steps previously required to mold the terminal within the substrate. The further advantage this achieves is that there is significantly less chance of trapping air or leaking unwanted air or other gas along one or more terminals within the substrate.

The pressure sensor of the invention has another advantage, in that it separates the electrical wire bonds, contacts, and other electrical components associated with the pressure-sensing element from the pressure-responsive gels or fluids typically provided in an ISO pressure transducer. It thus shields the wire bonds from shifting or moving because of movements in the fill fluid induced by the ISO diaphragm.

The invention further provides related methods for the manufacture of a pressure sensor and including the steps of providing a substrate having opposed first and second sides, and with a passageway therethrough, which further has an externally-accessible peripheral surface extending between the opposed sides. A pressure-sensing element, which produces a signal indicative of pressure, is bonded within the passageway to seal it closed with regard to pressure. Electrical terminals are secured to the substrate to overlie the peripheral surface and to provide for external electrical connection to the sensor. An electrical connection is formed between the electrical terminals and the pressure-sensing element, to communicate the signal from the sensing element to the terminals.

Further aspects of the process of the invention relate to the position of the terminals, the materials forming the substrate, and the connection of the pressure-sensing element to the terminals.

A method for manufacturing a pressure sensor according to the invention includes the further step of coupling the sensor to a header element that has an ISO diaphragm and a supportive housing. The ISO diaphragm isolates the sensitive pressure-sensing element from hostile environments. A pressure-responsive, incompressible fluid, gel, or oil is provided within the header housing and coupled between the isolation diaphragm and the pressure-sensing element.

These and other aspects and advantages of the invention are evident in the description which follows and in the accompanying drawings.

BRIEF DESCRIPTION OF THE DRAWINGS

FIG. 1 is a side elevation view, partly cut away, of a prior art infusion pump pressure transducer.

FIG. 3 is in a cross-sectional view of the pressure sensor of FIG. 2, along line 3—3.

FIG. 3A is a fragmentary detail of FIG. 3 and shows an optional feature of the sensor.

FIG. 4 is a cross-sectional view of an infusion pump transducer constructed in accordance with the invention with the pressure sensor of FIGS. 2 and 3.

DESCRIPTION OF ILLUSTRATED EMBODIMENTS

Figure 2:
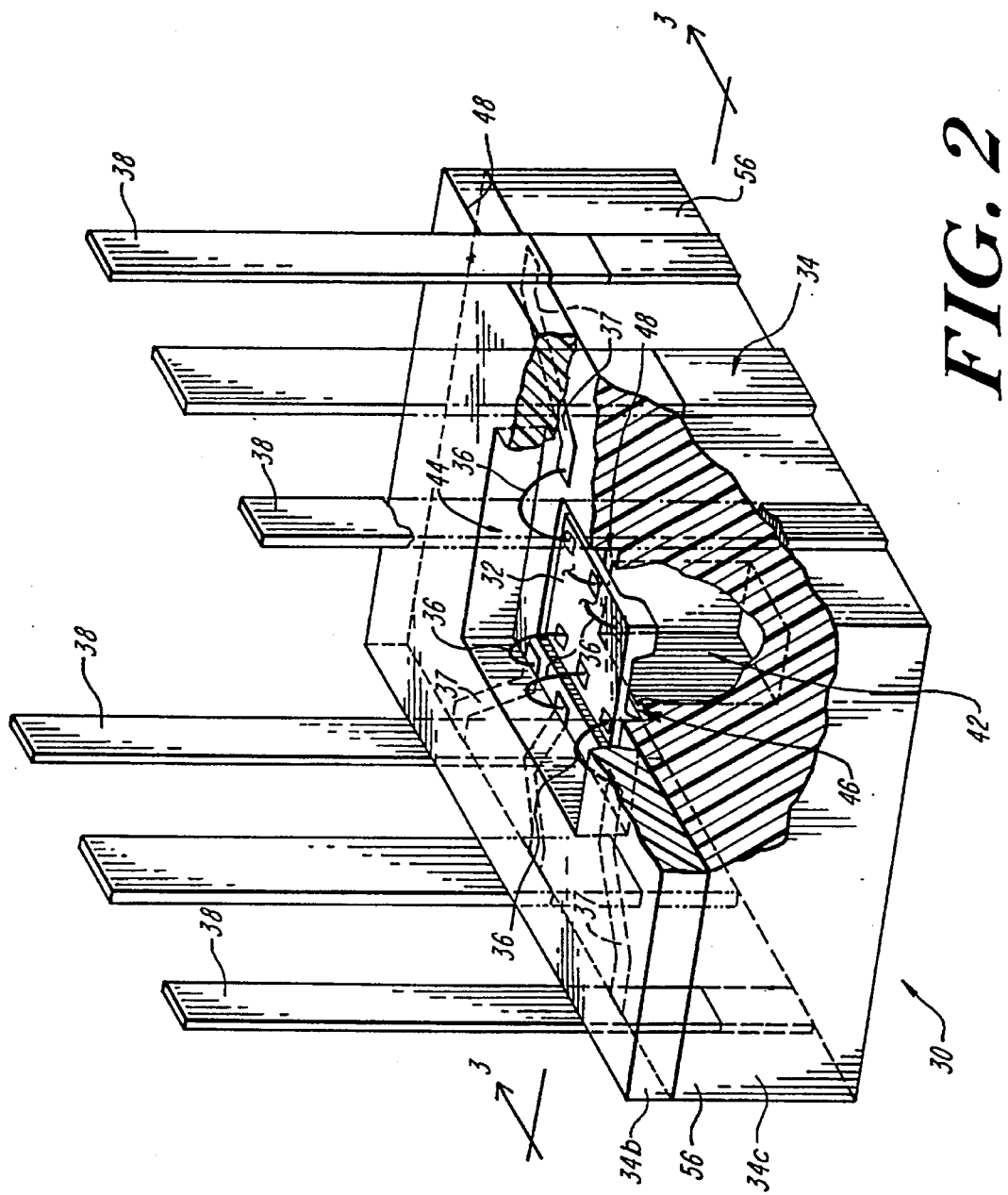
FIG. 2 is a perspective view, partly cutaway, of a pressure sensor according to one practice of the invention.

A prior art infusion pump pressure transducer 10 illustrated in FIG. 1 has a pressure-sensing element 12, typically having a silicon diaphragm and piezoresistive elements, supported by a housing 14. Electrical terminals 16 extend through the housing 14 and connect to the pressure-sensing element 12 via wire bonds 18. An isolation (ISO) diaphragm 20 is secured on the housing 14, and an incompressible flowable material 22 fills the cavity 23 formed within the housing 14 by the ISO diaphragm 20 and in which the sensing element 12 is seated. One side of the diaphragm of the sensing element 12 is thus subjected to a first pressure by way of the ISO diaphragm 20 and the liquid fill material 22. A passageway 24 extends through the housing 14 and couples a second pressure to the other side of the diaphragm of the sensing element.

In operation, the diaphragm of the sensing element 12 deflects in response to the difference between the first and second pressures. Piezoresistors or other gauge elements (not shown) coupled to the sensing element's diaphragm produce an electrical signal indicative of pressure in response to that deflection. The signal is communicated from the pressure-sensing element 12 through the wire bonds 18 to the electrical terminals 16, where external electronics can process the signal to determine, for example, the differential, pressure exerted on the ISO diaphragm 20.

FIG. 1 also illustrates problems and associated manufacturing difficulties inherent in prior pressure transducers, such as illustrated by the transducer 10. First, the electrical terminals 16 extend through the housing 14 to reach the cavity 23 containing the gel 22. The manufacture of the housing 14 with sealed and molded-in terminals 16 is difficult. The paths in the housing for the terminals 16 are susceptible to trapping air along the paths, or leaking air into the cavity 23. This is particularly true after the transducer 10 is used in a relatively hostile environment, or after the terminals are repeatedly flexed, as occurs when the transducer 10 is repeatedly connected to and disconnected from external electronics. Soldering to the terminals also can drive air in the fill chamber 23, due to trapped air or to outgassing.

Air which is trapped adjacent to the electrical terminals 16, or which leaks into the cavity 23, degrades performance and repeatability, and potentially destroys measurement accuracy and reliability. Leakage paths from the cavity 23, which typically occurs along the seating of the terminals 16 in the housing, are likewise detrimental. Significant manufacturing and quality control steps are thus taken with the prior art pressure transducer 10 to ensure that the terminals 16 are hermetically sealed in the housing 14. Nevertheless, the risk of trapping air or creating an unwanted air path to the cavity 23 remains.

Another problem with the transducer 10 is that the wire bonds 18 are within the gel 22. During localized deflection of the diaphragm. 20, particularly during handling or cleaning with uneven displacement of the isolation diaphragm as discussed above, the gel 22 can be displaced, thereby inducing forces on the wire bonds 18. These bonds 18 are not indelibly pliant. There is, in such a design, the risk that the bonds 18 will be damaged, or broken, thereby causing the transducer 10 to malfunction or to cease functioning.

This invention provides a modular pressure sensor 30, illustrated in FIGS. 2 and 3, and other embodiments of which are shown in FIGS. 4–9, which solves the foregoing and other problems.

The sensor 30 of FIGS. 2 and 3 has a substrate 34 that mounts a pressure-sensing element 32, and has externally accessible electrical terminals 38. The terminals 38, preferably in the form of electrical pins, are connected to the pressure-sensing element 32 by a way of electrical connections, illustrated as formed by wire bonds 36 and metallization paths 37. A lid 40 is preferably secured to the substrate 34.

More particularly, the illustrated substrate 34 is a rectangular solid with a recess extending between outer opposed planar surfaces 46 and 48, and with an outer peripheral surface 56. Within the substrate recess, a platform surface 43 extends parallel with the outer surfaces 46 and 48. The pressure-sensing element 32 is secured to the platform surface 43 and forms, within the substrate recess, a first chamber 42 between the sensing element 32 and one outer substrate surface 46, and forms a second chamber 44 between the sensing element 32 and the opposed outer substrate surface 48.

The illustrated lid 40, secured to the substrate outer surface 48 to bound the second chamber 44, has an aperture 50 to provide an atmospheric or other selected pressure passageway to the chamber 44 and thus to one side of the pressure-sensing element 32. The substrate 34 is typically fabricated in a known technique of a ceramic material or of a pyrex-based material, and is electrically non-conducting. The illustrated substrate has a laminated structure, with two laminae 34A and 34B shown in FIGS. 2 and 3. The copending and commonly assigned U.S. patent application Ser. No. 07/825,620 entitled Apparatus And Method Of Manufacture Of Pressure Sensor Having A Laminated Substrate, the disclosure which is incorporated herein by this reference, describes one detailed structure and method of fabricating the substrate 34 and some other parts of the sensor 30.

Unlike the prior art sensor 10 of FIG. 1, the sensor 30 of FIGS. 2 and 3 is not susceptible to the problems of trapped air or leaking air adjacent the electrical terminals 38, because the terminals 38 do not pass through the substrate 34. Instead, the terminals 38 of the sensor 30 are to external surfaces of the substrate 34. The illustrated terminals 38 are secured to the substrate peripheral surface 56 by brazing each one to metallization path, and in particular to a portion of the metallization path which extends along the surface 56. The terminals extend along the distance that separates the opposed substrate surfaces 46 and 48, and they extend beyond one such surface—illustrated as surface 48—to project from the substrate 34.

The electrical terminals 38 are connected electrically to contacts on the sensing element 32 by the conductive metalization paths 37, which extend within the substrate 34, and by wire bonds 36 connected between the metalization paths and the sensor contacts. The metalization paths 37 are readily fabricated on the substrate layer 34A to be at the interface between the two laminae 34A and 34B. This fabrication of metalization paths is described in the co-pending patent application referenced above. Each illustrated metalization path 37 is thus hermetically sealed within the substrate 34, and extends to the substrate peripheral surface 56, where a further portion of the path extends along the peripheral surface 56 and connects to one electrical terminal 38. Each wire bond 36 connects from one metalization path 37 to an electrical contact on the pressure sensing element 32.

The operation of the pressure sensor 30 in FIGS. 2 and 3 is generally similar to that of the prior art transducer 10 of FIG. 1. That is, the sensor 30 receives an applied pressure in the chamber 42 and couples it to one side of the sensing element 32. The sensor 30 receives an ambient or other reference or selected pressure by way of the aperture 50 in the chamber 44 and applies it to the other side of the sensing element 32. The resultant pressure differential across the sensing element 32 deflects the diaphragm of the sensing element, and the sensing element produces a corresponding electrical signal at its electrical contacts, as known in the art.

Note that the terminals 38 illustrated with solid lines in FIG. 3 extend downward, to project from the substrate 34 beyond the surface 48 and the lid 40, which bound the chamber 44 within which the wire bonds 36 are disposed. This is opposite to the direction in which the terminals 16 extend on the prior art sensor 10 of FIG. 1. Further, the invention can also be practiced with a sensor 30 structure as shown in FIGS. 2 and 3 and modified to have the terminals 38 extend upward, i.e. in the opposite direction from that shown with solid lines. In this alternative practice of the invention, shown with broken lines in FIG. 3, the terminals 38 extend to project from the substrate beyond the surface 46, which is opposed to the surface 48 and which is associated with the other sensor chamber 42. Thus, the external mounting of the electrical terminals 38 relative to the sensor substrate 34, in accord with the invention, allows the terminals to extend beyond and project from the substrate in either the upward or the downward position shown in FIG. 3, or, if desired, terminals 38 can be provided extending in both directions.

The lid 40 of the sensor 30 protects the wire bonds 36 and other elements of the sensor 30 that are exposed within the chamber 44, and yet keeps the chamber 44 in pressure communication with the ambient or selected reference pressure coupled to it by way of the aperture 50.

An optional element of the sensor 3 is a porous filter-like cap 52, shown in FIG. 3A, that closes the aperture 50 to exclude dirt and contaminants, and which is porous and hence has no pneumatic or fluid resistance to the pressure applied to the aperture 50.

FIG. 4 shows a pressure transducer 61, illustrated as an infusion pump transducer, according to the invention and in which the pressure sensor 30 of FIGS. 2 and 3 is mounted to a header 60. The illustrated header 60 includes a housing 66 and an isolation diaphragm 62 sealed to one wall of the housing. The illustrated housing 66, which can be of the same type as the prior art housing 14 (FIG. 1), is a solid mounting body having a mounting surface 66A and from which a central through recess 68 extends. The isolation diaphragm 62 seals the through recess closed at the side or end of the housing 66 opposite the mounting surface 66A. The pressure sensor 30 is seated within the through recess, between the mounting surface 66A and an intermediate inner surface 66B to which the sensor substrate outer surface 46 is bonded or otherwise secured in a manner known in the art. Only the terminals 38 of the sensor 30 project from the housing 66; as shown, they project beyond the housing mounting surface 66A for removable and replaceable connection with mating electrical socket elements (not shown).

With further reference to FIG. 4, an incompressible liquid 58 fills and is sealed within a cavity 64 of the housing recess 68 between the sensing element 32 and the isolation diaphragm 62. The liquid filled cavity 64 constitutes both the chamber 42 of the sensor 30 and the adjoining space of the housing recess 68.

The sensor chamber 44 in the illustrated transducer 61 of FIG. 4, through which the wire bonds 36 extend, is free of the fill liquid 58. With this arrangement, the wire bonds 36 are not subjected to disturbances of the fill liquid 58 as the isolation diaphragm 62 flexes in response to the pressure applied to it.

The transducer housing 66 is illustrative of a variety of housings to which the sensor 30 can be mounted, inasmuch as the sensor 30 is readily manufactured as a separate modular pressure sensor separate from the header 60 and can be mounted in a variety of headers or other supports to suit the user's needs. The illustrated header 60 of the FIG. 4 transducer 61 employs a housing 66 made of a medical grade plastic, for example, for use as a pressure transducer in an infusion pump for infusing liquids including blood or blood replacements.

The infusion pump transducer 61 of FIG. 4 illustrates how a pressure transducer in accordance with the invention solves problems associated with prior pressure transducers, including the transducer 10 of FIG. 1. The transducer 61, according to the invention, utilizes the modular pressure sensor 30, which is relatively easily coupled or tailored to the transducer header 60 according to the particular application. Further, the transducer is capable of relatively high performance and is relatively easily manufactured, due in part to the mounting of the electrical terminals 38 to an external surface of the sensor substrate, e.g., to the peripheral surface 56. The electrical terminals thus extend along a peripheral surface of the substrate and are readily connected electrically to the pressure sensing element 32 of the sensor through interconnections with minimal potential for an atmospheric or other gas leak into the cavity 64 that is filled with the fill liquid 58. This structure and manufacture of the sensor 30 and correspondingly of the transducer 61, reduce the requisite quality control measures and qualification tests. Further, the arrangement of the pressure sensing element in the sensor 30 removes the fill liquid 58 from the chamber in which the wire bonds 36 are disposed, which is understood to minimize flexing or other unwanted disturbance of the wire bonds 36.

The process for manufacturing a transducer, such as the transducer 61, in accordance with the invention includes the following steps, after the component parts are fabricated. The pressure-sensing element 32 is bonded to the platform surface 43 of the substrate 34. The bond is typically provided with a flexible epoxy having high tensile strength and sufficient flexibility to accommodate thermal expansion and contraction. This is followed by attaching of the wire bonds 36 between the contacts on the pressure sensing element and the metalization paths 37 exposed at the interface between the substrate laminae 34A and 34B. The terminals 38 are secured, as by brazing to the metallization paths, to the peripheral surface 56 of the substrate. After the lid 40 is secured to the substrate surface 48, the completed sensor is bonded to the housing 66 by adhering or otherwise securing the sensor surface 46 to the intermediate surface 66B of the housing. Thereafter, the housing cavity 64, which includes the sensor chamber 42, is filled with the fill liquid 58 and any remaining air is evacuated, and the chamber 64 is sealed closed with the isolation diaphragm 62. In one embodiment, the isolation diaphragm is a flexible silicone material.

FIGS. 5–9 illustrate other embodiments as side elevation views or as cross-sectional views, and each is of a sensor having a three-dimensional structure, just as FIG. 3 is a cross-sectional view of the three-dimensional structure shown in FIG. 2.

Figure 5:
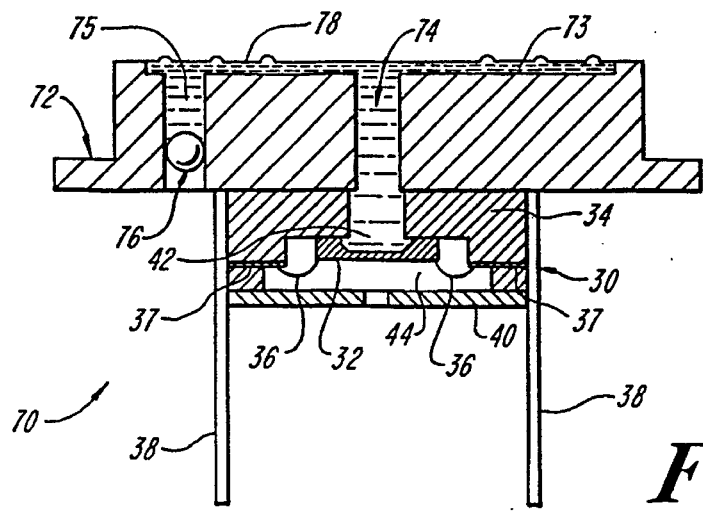
FIG. 5 is a cross-sectional view of another pressure transducer according to the invention employing the sensor of FIGS. 2 and 3.

FIG. 5 shows an isolated pressure transducer 70 in accord with the invention and in which the pressure sensor 30 of FIGS. 2 and 3 is mounted to a stainless steel header 72 by bonding the sensor substrate surface 46 to a flat surface 72A of the header 72. The illustrated header 72 has a central through passage 74 that communicates with the sensor chamber 42; the illustrated passage 74 extends along a central axis of the transducer and is aligned with the sensor cavity 42. The upper outer end of the passage 74 opens into a shallow recess 73 at the upper end of the header 72 and which is closed with an isolation diaphragm 78, typically of stainless steel, that is secured to the upper rim of the header 72. A fill passage 75 extends through the header 72, at a peripheral location to be radically outward from the sensor 30. With this arrangement, a fill fluid, typically an incompressible oil, fills the sensor cavity 42 and the header passage 74 and the recess 73. An oil fill ball 76 seals the fill passage 75 closed after the oil is introduced and air is removed from the chamber 42, passage 74 and recess 73.

The transducer 70 of FIG. 5 operates in a manner similar to the transducer 61 of FIG. 4, and produces at the terminals 38 an electrical output signal responsive to the difference between the pressure applied to the isolation diaphragm 78, which is coupled by way of the fill oil to the diaphragm of the sensing element 32, and a further pressure applied to the other side of the sensing element through the lid 40 to the chamber 44.

Figure 6:
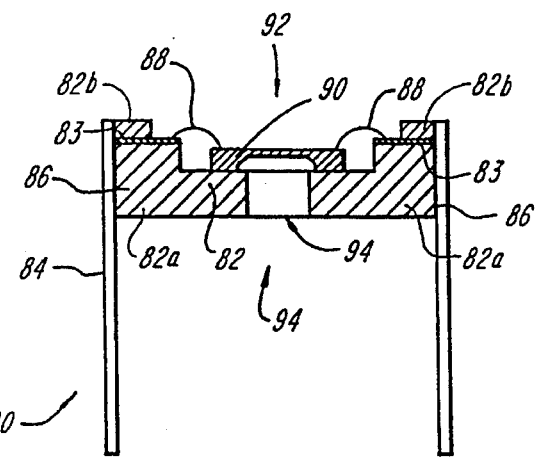
FIG. 6 is a cross-sectional view of a further pressure sensor in accordance with the invention and for use in "frontside" pressure-sensing.

FIG. 6 shows a further sensor 80 according to the invention and in which a substrate 82 mounts a pressure sensing element 90. The assembled substrate and sensing element are inverted relative to externally accessible electrical terminals 84, relative to the orientation in the sensor 30 of FIGS. 2 and 3. Similar to the construction of the sensor 30 of FIGS. 2 and 3, the FIG. 6 sensor 80 mounts the sensing element 90 on a substrate platform surface, and has wire bonds 88 connected between contacts on the sensing element and electrical interconnections 83, which typically are plated on one constituent laminar element of the substrate 83, as shown.

The electrical terminals 84, for external electrical connection to the sensor 80, are external to the substrate 82 and are attached to the substrate, typically by brazing to a substrate peripheral surface 86. However, in contrast to the sensor 30 of FIGS. 2 and 3, the illustrated electrical terminals 84 of the sensor 80 project from the substrate beyond the flat outer substrate surface 82A that is distal from the chamber in which the wire bonds 88 are disposed.

The pressure sensor 80 produces electrical signals at the terminals 84 in response to the difference in pressure applied to the sensing element 90, i.e., in response to the difference between an applied pressure 92 and an ambient or other reference pressure 94.

Figure 7:
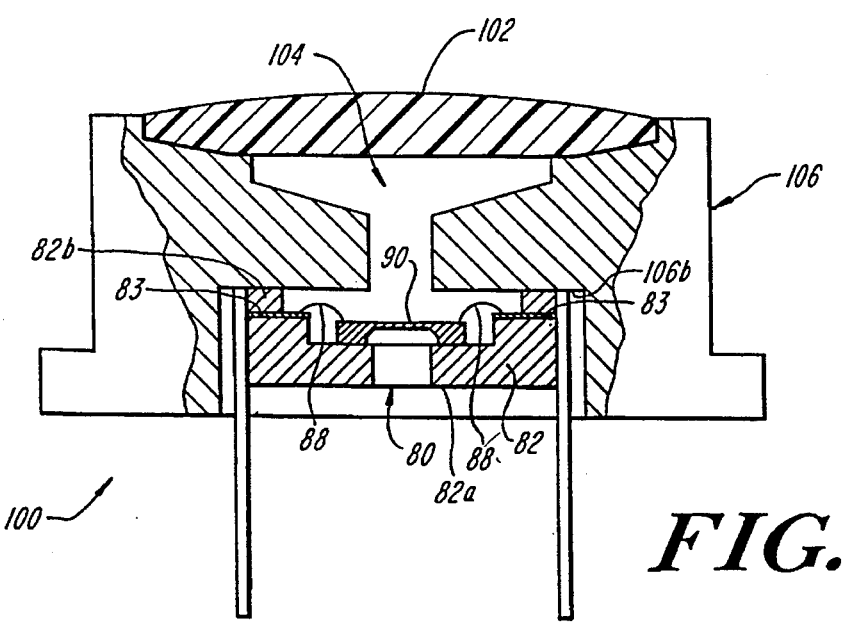
FIG. 7 is a cross-sectional view of an infusion pump pressure transducer constructed in accordance with the invention with the pressure sensor of FIG. 6.
Figure 8:
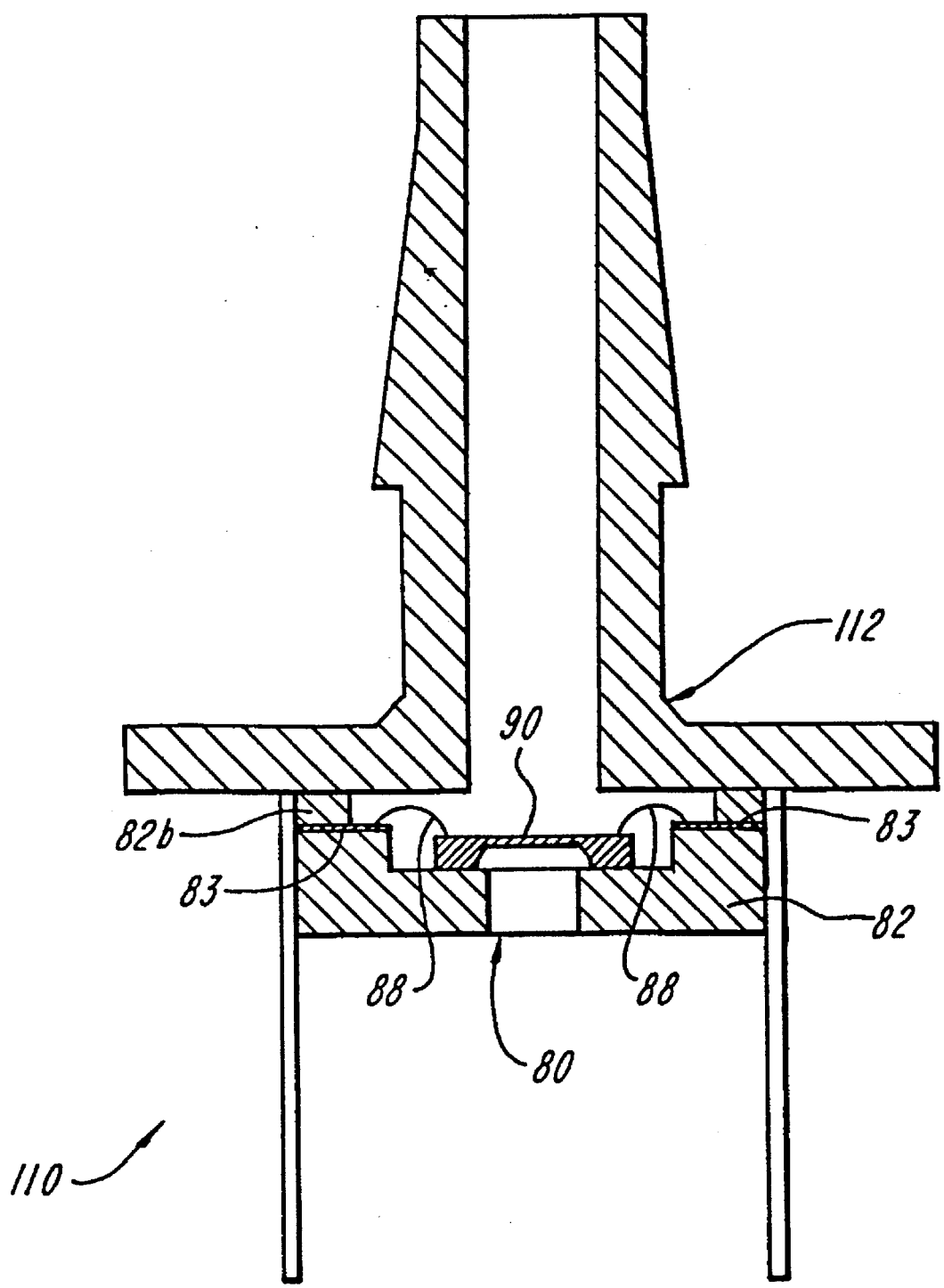
FIG. 8 is a cross-sectional view of another pressure transducer in accordance with the invention and featuring the pressure sensor of FIG. 6.

The sensor 80 of FIG. 6 can be mounted with a header or other support body in a manner similar to the sensor 30 of FIG. 3, as illustrated with the transducer 100 of FIG. 7. The illustrated transducer 100 employs a header 106 that illustratively is similar to the header 60 of the FIG. 4 transducer and is closed at one end with a flexible isolation diaphragm 102 similar to the isolation diaphragm 62 of FIG. 4. The sensor 80 is mounted to the header 106 by adhesively bonding or otherwise securing the substrate surface 82B, opposite the substrate surface 82A, to an internal platform surface 106B of the header. A pressure responsive gel or other selected fill fluid 104 is sealed between the sensor 80 and the isolation diaphragm 102, for coupling deflection of the isolation diaphragm 102 to the diaphragm portion of the sensing element 90.

With the illustrated configuration of the sensor 80, FIG. 7, such that the wire bonds 88 are in the sensor chamber that faces into the header 106 and that hence is filled with the pressure responsive gel 104, the sensor contacts and the wire bonds 88 are exposed and subjected to fluctuations of the pressure responsive gel 104. However, in this orientation, the sensor contacts and the wire bonds 88 are isolated from any contamination or corrosive or like detrimental condition that may be coupled to the sensor chamber 105. The wire bonds are protected from possibly damaging uneven pressure fluctuations in the gel by the necked configuration of the gel cavity in header 106.

FIG. 8 shows, again with a cross sectional representation, a low-cost pressure transducer indicated generally at 110 and in which the pressure sensor 80 of FIG. 6 is mounted to a hollow, tubular nozzle-like protective cap 112. The illustrated transducer 110 mounts the sensor 80 to the underside of a peripheral flange, typically circular in shape, located at the base of a hollow tubular stem, and the central axial hollow extending through the stem of the cap communicates and is aligned with the chamber 90A that is on one side of the sensing element 90 of the transducer 80. The sensor 80 is mounted to the cap by bonding the sensor substrate surface 82B to the base surface of the protective cap, as shown. The transducer 110 exposes the sensor chamber 90A, in which the wire bonds 88 and the sensor contacts are disposed, to the pressured gas or other fluid within the tubular passage of the protective cap. The other sensor chamber 90B receives a different, typically reference-value pressure.

Figure 9:
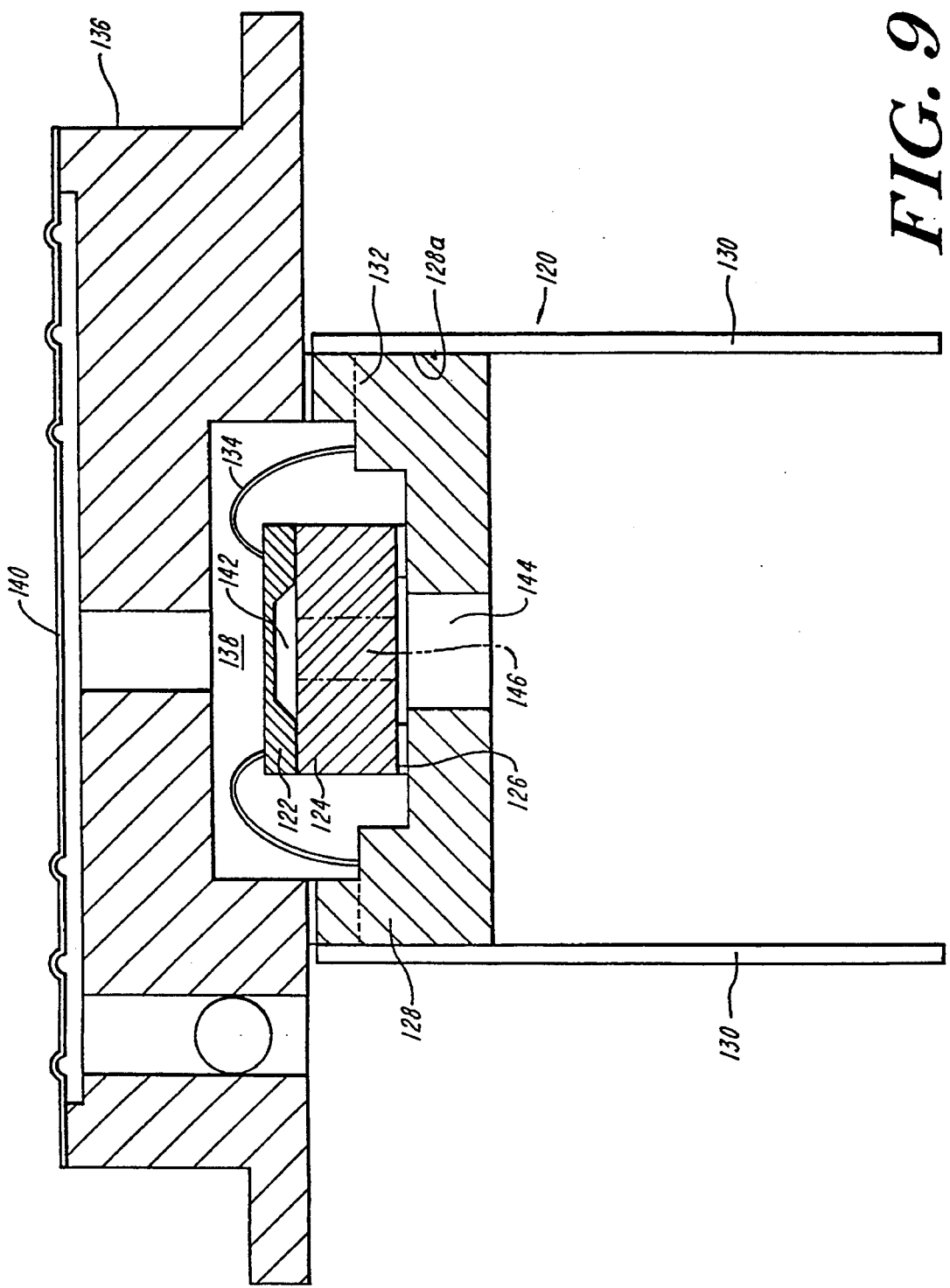
FIG. 9 is a cross-sectional view of a further pressure transducer according to the invention and mounting; a sensing element on a highly rigid member.

A further pressure transducer 120 in accordance with the invention, shown in FIG. 9, mounts a sensing element 122 on a highly rigid support 124, illustrated as made of pyrex glass. The support 124 in turn is mounted, preferably with a layer 126 of flexible epoxy, on a dielectric substrate 128. Externally accessible electrical terminals 130 are secured to an outer peripheral surface 128a of the substrate and extend from it. Metalization paths 132, that extend within the substrate, and wire bonds 134 interconnect the sensing element 122 with the electrical terminals 130.

This assemblage forms a sensor that mounts to one side of a flanged header 136. The illustrated header 136, similar to the header 72 of the FIG. 5 transducer 70, forms with the sensor a fluid-filled chamber 138 to which a sensing diaphragm of the sensing element 122 is exposed.

The illustrated transducer 120 of FIG. 9 provides an absolute measure of pressure applied to an isolation diaphragm 140 of the header. The measurement is with reference to a reference pressure within a chamber 142 formed and sealed between one side of the sensing diaphragm of the sensing element 122 and the rigid support 124. The reference chamber 142 is preferably evacuated, illustratively to a vacuum of one ten-thousandths Torr. Accordingly, the central pressure passage 144 in the illustrated substrate 128 serves no function and accordingly can be omitted.

FIG. 9 also shows, a variation of the pressure transducer 120 in which the sensing chamber 142 is coupled to a selected pressure, for providing differential pressure measurements. A pressure passage 146, shown with dashed lines, extends centrally through the rigid support 124, from the chamber 124 to the passage 144 for the differential operation.

Pressure sensors according to the invention, as described and illustrated herein, have several advantages. The sensor is durable and is capable of relatively high performance with respect to drift, repeatability, durability and temperature changes. The sensors are essentially free of the prior art problems of contamination of a sensor chamber with air or other gas entering from the seating of electrical terminals through and within the sensor substrate. Further, the sensors are suited for fabrication as a modular element that can be employed in a variety of transducers and other pressure sensing devices by mounting with a variety of headers and other mounting structures and with different orientations. Further, sensors according to the invention can be fabricated with relatively small volume chambers on either side of the sensing diaphragm. These small volume chambers and the corresponding small volumes of fill liquid and isolation diaphragm, enhance performance over a range of operating temperatures by reducing detrimental effects of thermal bias and/or of thermal expansion and contraction of the liquid fill fluid. Another advantage is that the wire bonds of the sensor can be oriented to be isolated from the fill liquid and thus not subjected to stresses coupled by way of the fill liquid.

The mounting of electrical terminals external to the sensor substrate not only avoids problems of trapped and leaked air or other gas as noted, it also allows the terminals to flex and be stressed during connection and release from mating electrical contacts, with minimal stress of the sensor substrate.

The invention thus attains the objects set forth above, among those apparent from preceding description. Since certain changes may be made in the above sensor structures without departing from the scope of the invention, it is intended that all matter contained in the above description or shown in the accompanying drawing be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and secured by Letters Patent is:

1. Pressure sensor apparatus comprising
   A. a substrate having a first surface and having a second surface peripheral to said first surface and having a platform surface opposed to and spaced from said first surface,
   B. a pressure-sensing element mounted to said platform surface of substrate, said sensing element having a pressure responsive diaphragm and having at least one electrical contact at which it produces a signal responsive to the deflection of said diaphragm,
   C. means forming a first chamber between said platform surface of said substrate and said pressure sensing element, said first chamber being closed,
   D. isolation means mounted to said substrate for forming a second closed chamber,
   E. at least one electrical terminal mounted onto said substrate and disposed external to said peripheral surface, said electrical terminal being arranged for removable and replaceable connection with a further connector element, and
   F. means forming an electrical connection extending between said contact and said electrical terminal, said means including a metalization path within said substrate.

2. Pressure sensor apparatus according to claim 1, wherein said isolation means further comprises an isolation diaphragm mounted to a header having a through passage.

3. Pressure sensor apparatus according to claim 2, wherein said second chamber is filled with a pressure responsive gel and wherein said through passage is necked for protecting said electrical connection means from fluctuations of said gel.

4. Pressure sensor apparatus according to claim 1, wherein said electrical terminal extends in a direction from said first surface to said platform surface and beyond said platform surface along at least a portion of said peripheral surface.

5. Pressure sensor apparatus according to claim 1, wherein said electrical terminal extends in a direction from said platform surface to said first surface and beyond said first surface along at least a portion of said peripheral surface.

6. Pressure sensor apparatus according to claim 1, wherein said first closed chamber has a selected reference pressure therein for providing a reference pressure measurement.

7. Pressure sensor apparatus according to claim 1, wherein said first closed chamber is evacuated to substantially form a vacuum therein for providing an absolute pressure measurement.

8. Pressure sensor apparatus comprising
   A. a substrate having a first surface and having a second surface peripheral to said first surface and having a platform surface opposed to and spaced from said first surface and having a first through passage open at said platform surface,
   B. a pressure-sensing element mounted to said platform surface of said substrate, said sensing element having a pressure responsive diaphragm and having at least one electrical contact at which it produces a signal responsive to the deflection of said diaphragm,
   C. means forming a first chamber between said platform surface of said substrate and said pressure sensing element, said first chamber communicating with said first through passage at said platform surface,
   D. a lid mounted to said substrate adjacent said platform surface, said lid having an aperture formed therethrough and arranged such that a first side of said pressure sensing element is subjected to a first pressure by way of said first through passage and a second side of said pressure sensing element is subjected to a second pressure by way of said aperture,
   E. at least one electrical terminal mounted onto said substrate and disposed external to said peripheral surface, said electrical terminal being arranged for removable and replaceable connection with a further connector element, and
   F. means forming an electrical connection extending between said contact and said electrical terminal, said means including a metalization path within said substrate.

9. Pressure sensor apparatus according to claim 8 wherein said electrical terminal is brazed to said peripheral surface.

10. Pressure sensor apparatus according to claim 8 wherein said means forming an electrical connection comprises at least one metalization path extending within said substrate and further comprises at least one wire bond extending between one said contact and said metalization path.

11. Pressure sensor apparatus according to claim 8 wherein a filter closes said aperture in said lid, said filter having substantially no fluid resistance.

12. Pressure sensor apparatus, comprising
   A. a substrate having a first surface and having a second surface peripheral to said first surface and having a platform surface opposed to and spaced from said first surface and having a first through passage open at said platform surface,
   B. a pressure-sensing element mounted to said platform surface of said substrate, said sensing element having a pressure responsive diaphragm and having at least one electrical contact at which it produces a signal responsive to the deflection of said diaphragm,
   C. means forming a first chamber between said platform surface of substrate and said pressure sensing element, said first chamber communicating with said first through passage at said platform surface,
   D. at least one electrical terminal mounted onto said substrate and disposed external to said peripheral surface, said electrical terminal extending in a direction from said first surface to said platform surface and beyond said platform surface along at least a portion of said peripheral surface, said electrical terminal being arranged for removable and replaceable connection with a further connector element, and E. means forming an electrical connection extending between said contact and said electrical terminal, said means including a metalization path within said substrate.

13. Pressure sensor apparatus according to claim 12, further comprising a lid being mounted to said substrate adjacent said platform surface.

14. Pressure sensor apparatus according to claim 13, wherein said lid includes an aperture formed therethrough such that a first side of said pressure sensing element is subjected to a first pressure by way of said first through passage and a second side of said pressure sensing element is subjected to a second pressure by way of said aperture.

15. Pressure sensor apparatus according to claim 14, wherein a filter closes said aperture in said lid, said filter having substantially no fluid resistance.

* * * * *